(12) United States Patent  
Kretchmer et al.

(10) Patent No.: US 8,099,692 B1
(45) Date of Patent: Jan. 17, 2012

(54) POWER-DRIVEN TIMING ANALYSIS AND PLACEMENT FOR PROGRAMMABLE LOGIC

(75) Inventors: Yaron Kretchmer, Fremont, CA (US); Paul Leventis, Toronto (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/953,764

(22) Filed: Nov. 24, 2010

Related U.S. Application Data

(62) Division of application No. 10/907,049, filed on Mar. 17, 2005, now Pat. No. 7,861,190.

(51) Int. Cl.
*G06F 17/50* (2006.01)
(52) U.S. Cl. ........................................ 716/100
(58) Field of Classification Search .............. 716/100
See application file for complete search history.

(56) References Cited

U.S. PATENT DOCUMENTS

| | | | |
|---|---|---|---|
| 5,598,348 A | 1/1997 | Rusu et al. | |
| 5,946,219 A * | 8/1999 | Mason et al. | 716/117 |
| 6,058,252 A | 5/2000 | Noll et al. | |
| 6,813,754 B2 | 11/2004 | Wu et al. | |
| 6,823,502 B2 | 11/2004 | Wingren et al. | |
| 6,838,904 B1 | 1/2005 | Agrawal et al. | |
| 6,857,110 B1 | 2/2005 | Rupp et al. | |
| 6,862,548 B1 | 3/2005 | Chan | |
| 6,971,074 B2 | 11/2005 | Hasegawa et al. | |
| 6,978,431 B2 | 12/2005 | Hirakimoto et al. | |
| 6,978,433 B1 | 12/2005 | Gan et al. | |
| 7,034,569 B1 | 4/2006 | Balasubramanian et al. | |
| 7,133,819 B1 | 11/2006 | Hutton | |
| 7,137,093 B2 | 11/2006 | Harn | |
| 7,188,327 B2 | 3/2007 | Hahn | |
| 7,210,115 B1 | 4/2007 | Rahim et al. | |
| 7,714,610 B2 | 5/2010 | He | |
| 7,757,195 B2 | 7/2010 | Smith et al. | |
| 2002/0049958 A1 | 4/2002 | Shimazawa | |
| 2004/0073878 A1 * | 4/2004 | Hasegawa et al. | 716/8 |
| 2005/0040851 A1 * | 2/2005 | New | 326/41 |
| 2005/0097485 A1 | 5/2005 | Guenthner et al. | |
| 2005/0268258 A1 | 12/2005 | Decker | |
| 2007/0164785 A1 * | 7/2007 | He | 326/41 |
| 2007/0198971 A1 * | 8/2007 | Dasu et al. | 717/140 |

* cited by examiner

*Primary Examiner* — Suchin Parihar
(74) *Attorney, Agent, or Firm* — Ropes & Gray LLP

(57) ABSTRACT

An integrated circuit is divided into two or more different regions, each region being a different voltage domain. In each of the regions, a voltage drop and its impact on performance will be quantified. A place and route engine (or another tool of a computer-aided design flow) will then take these timing considerations into account while performing partitioning of the device. A user's logic design is implemented into the logic array blocks taking into a voltage drop seen at those logic array blocks. Faster paths of the logic design are placed into faster logic array blocks, such as those in a core region of the integrated circuit.

13 Claims, 7 Drawing Sheets

Example of a Computer-Aided Design Flow

POWER-DRIVEN TIMING ANALYSIS AND PLACEMENT FOR PROGRAMMABLE LOGIC

CROSS REFERENCE TO RELATED APPLICATION

This is a division of commonly-assigned U.S. patent application Ser. No. 10/907,049, filed Mar. 17, 2005, now U.S. Pat. No. 7,861,190, which is hereby incorporated by reference herein in its entirety.

BACKGROUND OF THE INVENTION

The present invention relates to the area of electronic design automation of logic design and in particular, taking into consideration power-driven timing analysis when placing a user design in a programmable integrated circuit.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables.

Programmable logic integrated circuits also included embedded functionality such as user-programmable memory or RAM, digital signal processors (DSPs), and on-board microcontrollers such as ARM-based or MIPS-based controllers.

As integrated circuits become more complex and provide more functionality in a smaller die size, it also becomes increasingly difficult to ensure the logic functions are implemented properly and in an optimal way. Modern digital integrated circuits have many transistors and many logic gates, more so than can be optimized manually in a reasonable amount of time, especially when time-to-market is critical in ensuring a product's success. As a specific example, a typical programmable logic design today surpasses the multimillion-gate mark.

Computer aided design (CAD) and electronic design automation (EDA) tools are available to assist engineers with the design and verification tasks. These tools are especially helpful for complex logic designs. But even with the help of computer-aided tools, the process of optimizing an integrated circuit design can be time-consuming because of the large number of variables involved. It is desirable that the design automation task is done time efficiently even for large designs. Further, it is desirable that the design automation tool maximizes performance or otherwise improves an aspect of an integrated circuit design. Some other aspects of a design that a tool may help with include improving critical path performance, removing metastability, reducing the number of logic gates used, checking or verifying functionality, removing race conditions, and others.

An important consideration when placing a user design in a programmable integrated circuit is improving performance. In the integrated circuit, there are voltage rails, which are a collection of pieces of metal found inside a chip. These are used to deliver power from a chip package to the semiconductor devices (e.g., transistors) inside the chip. The semiconductor devices are used to create the configurable logic, such as logic array blocks, of a programmable integrated circuit.

In a typical flip-chip device, there are many bumps concentrated in the center of the die. These may be referred to as "core bumps." Many bumps mean that the voltage drop in the center of the die will generally be small. There are typically fewer bumps in the periphery of the die. These may be referred to as "periphery bumps." Few bumps mean that the voltage drop in the periphery will be significantly higher in that area. Typically, it is not possible to add more bumps at the periphery, since that area of the die is heavily congested with routing. The periphery is where the data signals to and from the I/Os are situated.

Therefore, circuitry and logic in the periphery bump region are connected to voltage rails of the core bump region and will have a higher voltage drop characteristic than for that in the core. The circuitry and logic in the periphery bump region will typically be slower performance-wise (e.g., higher propagation delay and lower Fmax) than that in the core.

As can be appreciated, there is a need to provide an electronic design automation system to improve the performance of an integrated circuit design, and in particular, to take into account the voltage drop characteristics of logic blocks of the programmable logic integrated circuit when placing a user design into a programmable integrated circuit.

SUMMARY OF THE INVENTION

A technique of the invention includes separating an integrated circuit into two or more different regions, each region considered to be a different voltage domain. In each of the regions, a voltage drop and its impact on performance will be quantified. A place and route engine (or another tool of a computer-aided design flow) will then take these timing considerations into account while performing partitioning of the device. In other words, a user's logic design is implemented into the logic array blocks taking into a voltage drop seen by those logic array blocks. Faster paths of the logic design are placed into faster logic array blocks, such as those in a core region of the integrated circuit.

According to an aspect of the invention, an integrated circuit is divided in a core region, which will be a low voltage drop region, and a periphery region, which will be a high voltage drop region. When placing a user logic design, the logic array block or other configurable elements in the core region will be used for logic paths which require high speeds before elements in the periphery region. This will improve the performance of the design since the fastest logic array blocks will be used first.

The user may also denote or otherwise indicate certain paths as being high-speed or "critical." These critical paths will be placed in the core region in order to obtain the best possible performance. In cases when it is not possible to place the entire critical path into the core region, a warning may be provided to the user to notify the user. Then, the user may make adjustments as needed to ensure fast performance is achieved.

Overall, the technique of the invention will increase the speeds of the programmable logic integrated circuits because the devices no longer need to be characterized on the worst-case performance (i.e., periphery region performance).

Other objects, features, and advantages of the present invention will become apparent upon consideration of the

BRIEF DESCRIPTION OF HE DRAWINGS

DETAILED DESCRIPTION

Figure 1A:
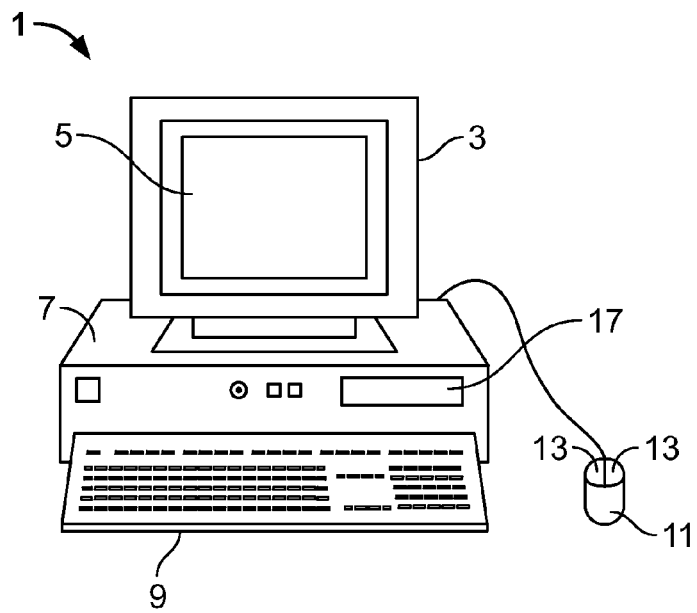
FIG. 1A shows an embodiment of a system of the invention.

FIG. 1A shows a system of the present invention for performing power-driven timing analysis and placement for programmable logic. In an embodiment, software of the invention executes on a computer workstation system, such as shown in FIG. 1A. FIG. 1A shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIPT™ disks, magnetic disks, fixed disks, hard disks, CD-ROMs, recordable CDs, DVDs, DVD-R, DVD-RW, Flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, or CD-ROM).

Figure 1B:
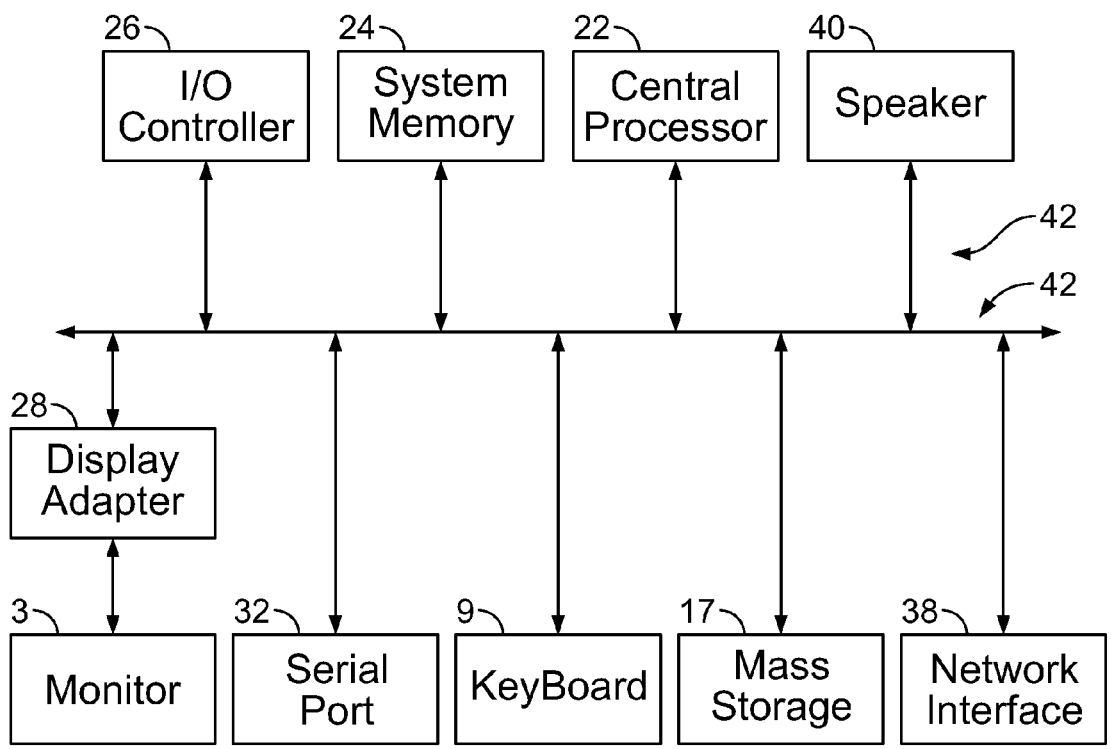
FIG. 1B shows a more detailed block diagram of the system of FIG. 1A.

Furthermore, FIG. 1B shows a system block diagram of computer system 1 used to execute the software of the present invention. As in FIG. 1A, computer system 1 includes monitor 3, keyboard 9, and mass storage devices 17. Computer system 1 further includes subsystems such as central processor 22, system memory 24, input/output (I/O) controller 26, display adapter 28, serial or universal serial bus (USB) port 32, network interface 38, and speaker 40. The invention may also be used with computer systems with additional or fewer subsystems. For example, a computer system could include more than one processor 22 (i.e., a multiprocessor system) or a system may include a cache memory.

Arrows such as 42 represent the system bus architecture of computer system 1. However, these arrows are illustrative of any interconnection scheme serving to link the subsystems. For example, speaker 40 could be connected to the other subsystems through a port or have an internal direct connection to central processor 22. Computer system 1 shown in FIG. 1A is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks, .mathworks.com), SAS, SPSS, and Java. The computer software product may be an independent application with data input and data display modules. Alternatively, the computer software products may be classes that may be instantiated as distributed objects. The computer software products may also be component software such as Java Beans (from Sun Microsystem), Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, pattern recognition may be performed via distributed computer through this network, where each computer in the network performs part of the task of the many series of pattern recognition steps in parallel. Furthermore, the network may be an intranet, internet, or the Internet, among others. The network may be a wired network (e.g., using copper), telephone network, packet network, an optical network, or a wireless network. For example, data and other information may be passed between the computer and components (or steps) of a system of the invention using a wireless network using a protocol such as Wi-Fi (IEEE standard 802.11, 802.11a, 802.11b, 802.11g, and 802.11i to name a few examples). For example, signals from a computer may be transferred, at least in part, wirelessly to a programmable logic integrated circuit.

Figure 1C:
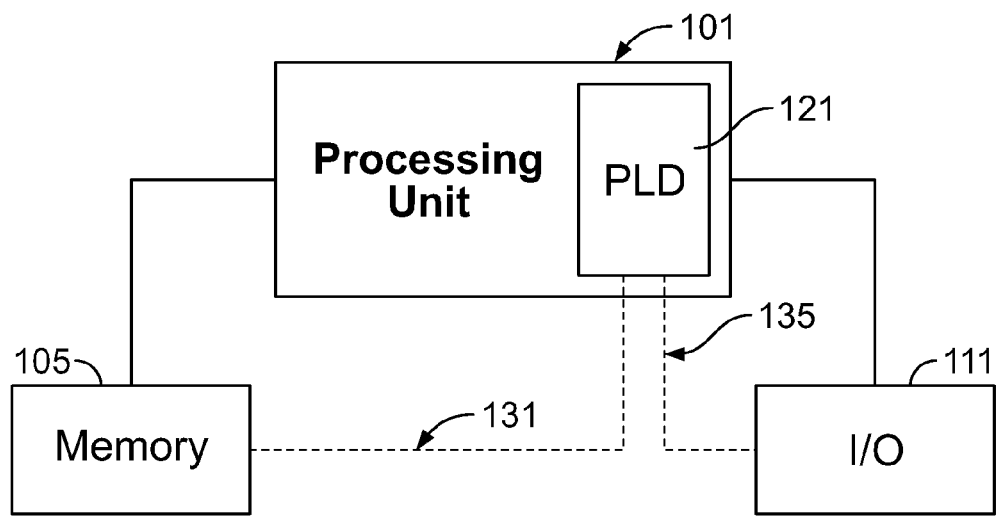
FIG. 1C is diagram of a digital system with a programmable logic integrated circuit.

FIG. 1C shows a block diagram of a digital system, which the system the invention may incorporate or operate on. The system may be provided on a single board, on multiple boards, or within multiple enclosures. Though embodiments of the present invention are useful in electronic and integrated circuits in general, they are particularly useful in programmable logic devices. FIG. 1C illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, e.g., by Altera Corporation of San Jose, Calif. Programmable logic integrated circuits and their operation are well known to those of skill in the art.

In the particular embodiment of FIG. 1C, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
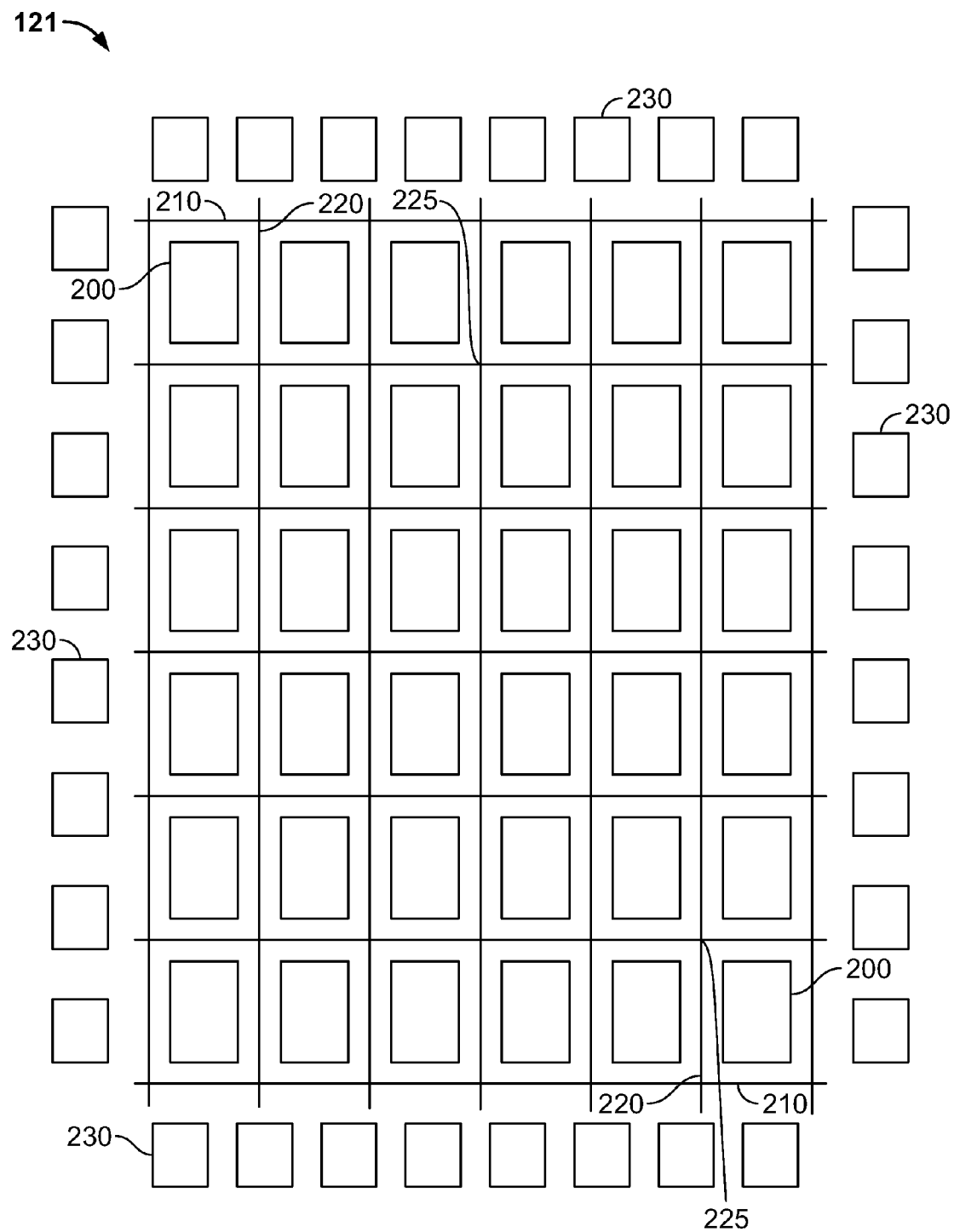
FIG. 2 is a diagram showing a floor plan of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of horizontal interconnects 210 and vertical interconnects 220. Although shown as single lines in FIG. 2, each set of interconnect lines may represent a plurality of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
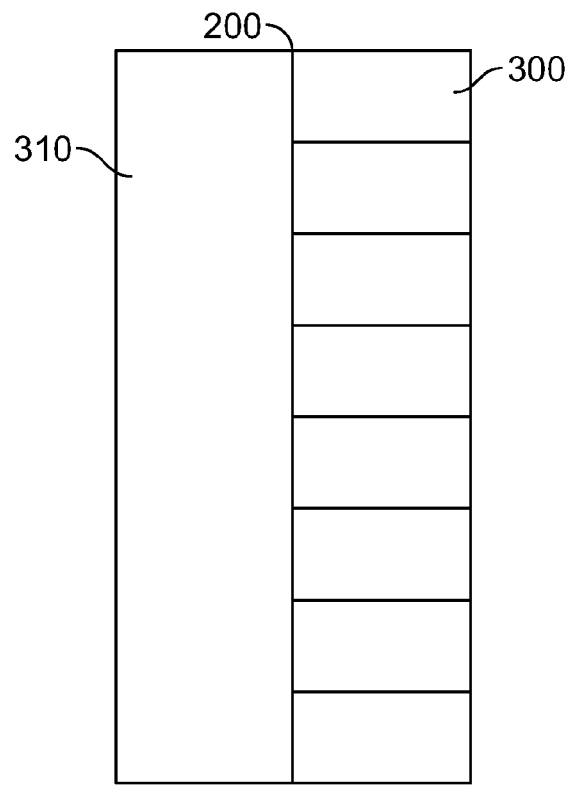
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells" or LCELLs, and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 incorporates a function generator that is configurable to provide a logical function of a number of variables, such a four-variable Boolean operation. As well as combinatorial functions, LE 300 also provides support for sequential and registered functions using, for example, D flip-flops. For example, a logic element includes combinational and sequential blocks. The combinational blocks may be implemented using product terms or a look-up table, as a couple of examples. The sequential block may be a flip-flop, D flip-flop, or register.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
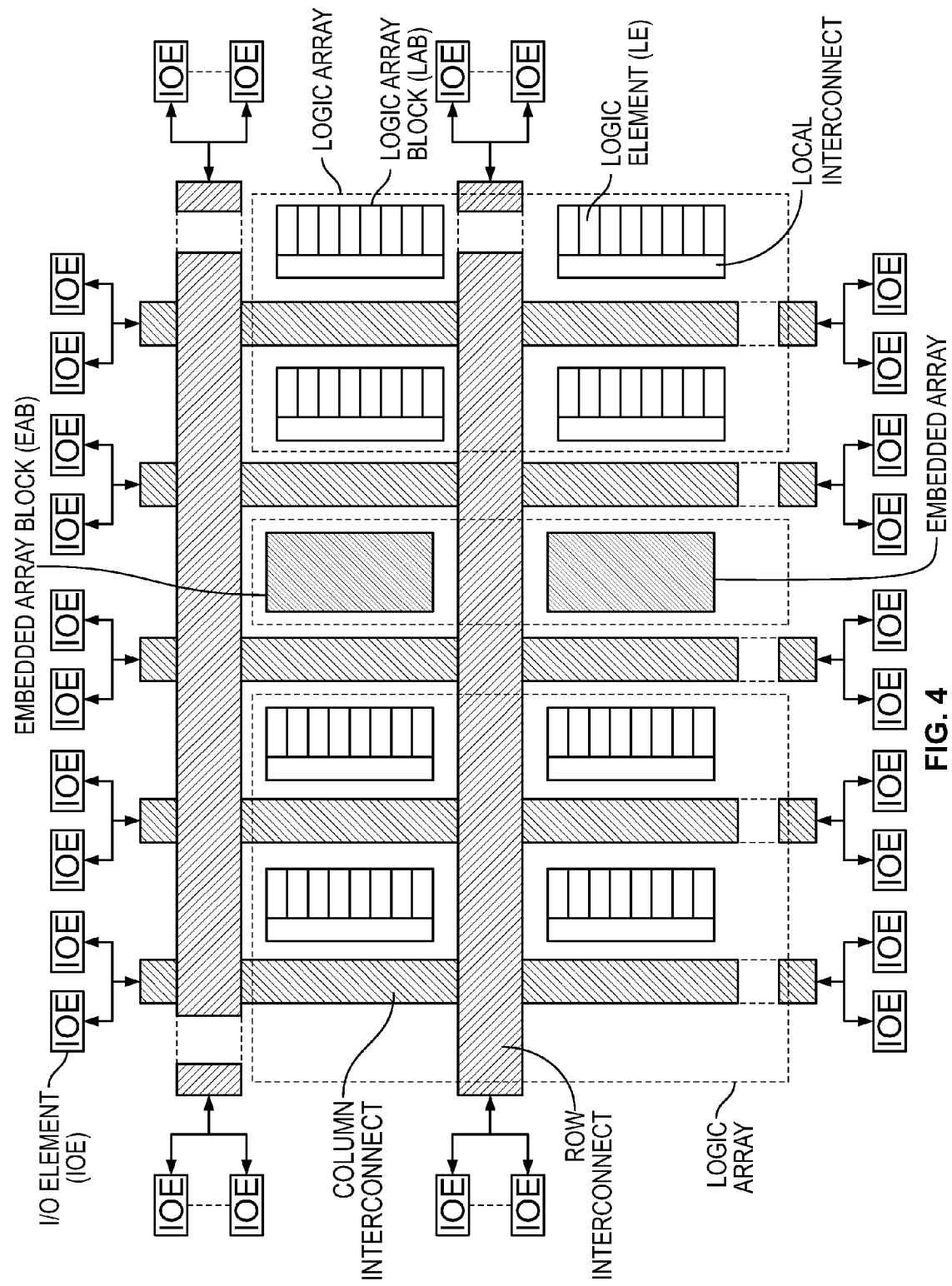
FIG. 4 is a diagram showing a programmable logic architecture with embedded array blocks (EABs) and logic array blocks (LABs).

FIG. 4 shows an example for a typical programmable logic architecture. The architecture in FIG. 4 further includes embedded array blocks (EABs). EABs contain user memory, a flexible block of RAM. The embedded array blocks can be configured as FIFOs acting as frequency translators and serial to parallel converters for interfacing between high-speed input and outputs and the core circuits including the logic array blocks.

Figure 5:
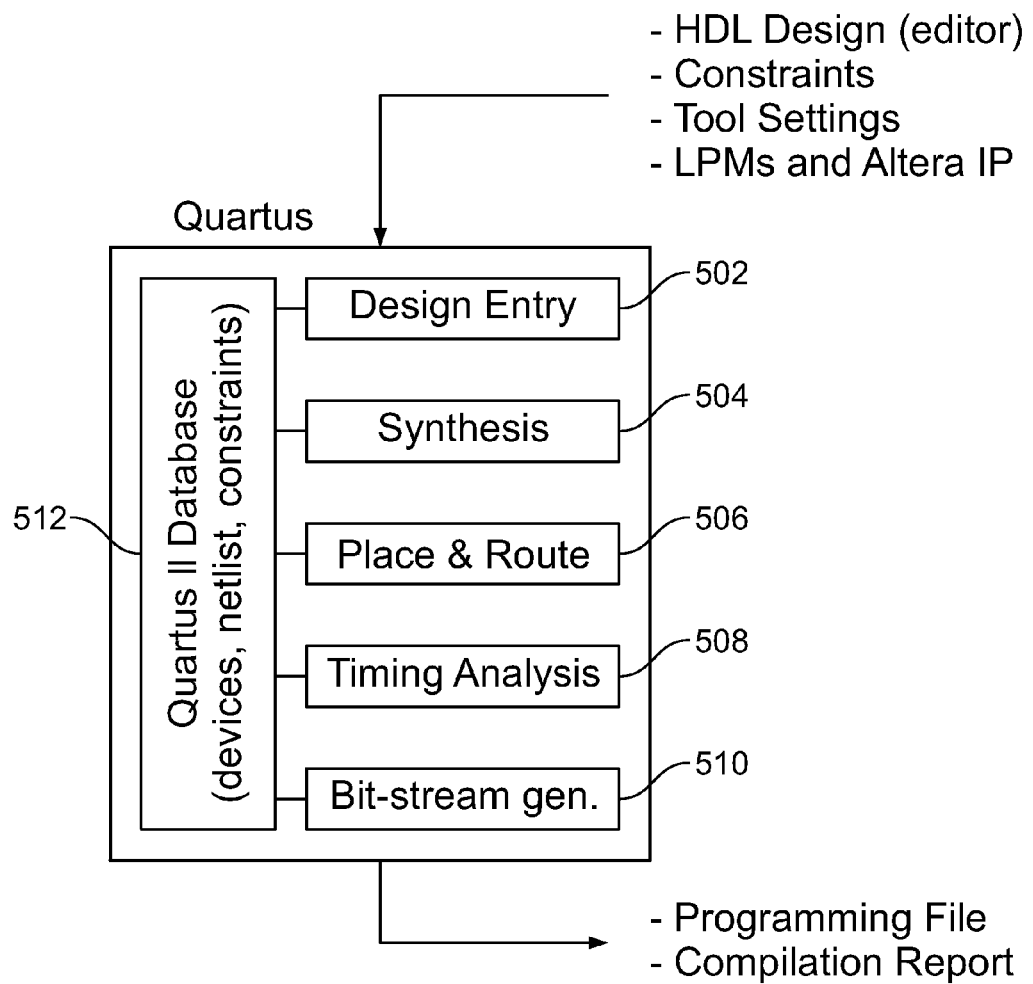
FIG. 5 shows an overall diagram of a computer-aided design (CAD) or electronic design automation (EDA) flow including synthesis.

FIG. 5 shows an example of a flow diagram of an electronic design automation (EDA) or computer-aided design (CAD) tool used in the design of integrated circuits including microprocessors, ASICS, memories, FPGAs, PLDs, and others. In a specific implementation, this flow is used to configure a programmable logic integrated circuit. As discussed above, a user typically programs a programmable logic integrated with the user's desired logic. FIG. 5 is an example of one technique of designing and implementing logic for a programmable logic integrated circuit. At Altera, a particular implementation of the technique of this flow is implemented using a software system referred to as Quartus. This is just an example. One could draw the flow with more or fewer steps and targeting a specific or more general device hardware. The most common implementation of this flow would be as a computer program executing as part of a system similar to that shown in FIG. 1, though other implementations are possible.

The steps of the flow include design entry 502, synthesis 504, place and route 506, timing analysis 508, and bitstream generation 510. Each of these steps in the process may access, store, or retrieve data from a database 512. The database may include devices, a netlist, and constraints.

For example, when implementing a user design into a programmable integrated circuit, such as a programmable logic integrated circuit, PLD, FPGA, and others, the user provides a design using logical components. Example of designs are a microprocessor, memory, network processor, or an application-specific circuit. The user may input the design using a design entry tool, such as using a schematic capture tool and assembling the design using a display and selection or point device (e.g., mouse or pen tablet). Alternatively, a netlist of the user design may be provided or generated. The database will store the user design, which may be in netlist form, devices, constraints, and other information.

The synthesis and place and route tools implement the user design into the programmable integrated circuit by determining equivalent functionality as the user design using logic array blocks. For example, a NAND gate may be implemented using a look-up table in a logic array block. A timing analysis tool may perform a timing evaluation of the design. If a timing specification is not met, then synthesis and place and route may be performed again until the timing specification is achieved. A bitstream generation tool generates the bit pattern (also know as configuration data), that may be input to a programmable integrated circuit to configure it with the user design. For example, upon power-up of an FPGA, configuration data stored in an EPROM is transferred to the FPGA to configure it.

Figure 6:
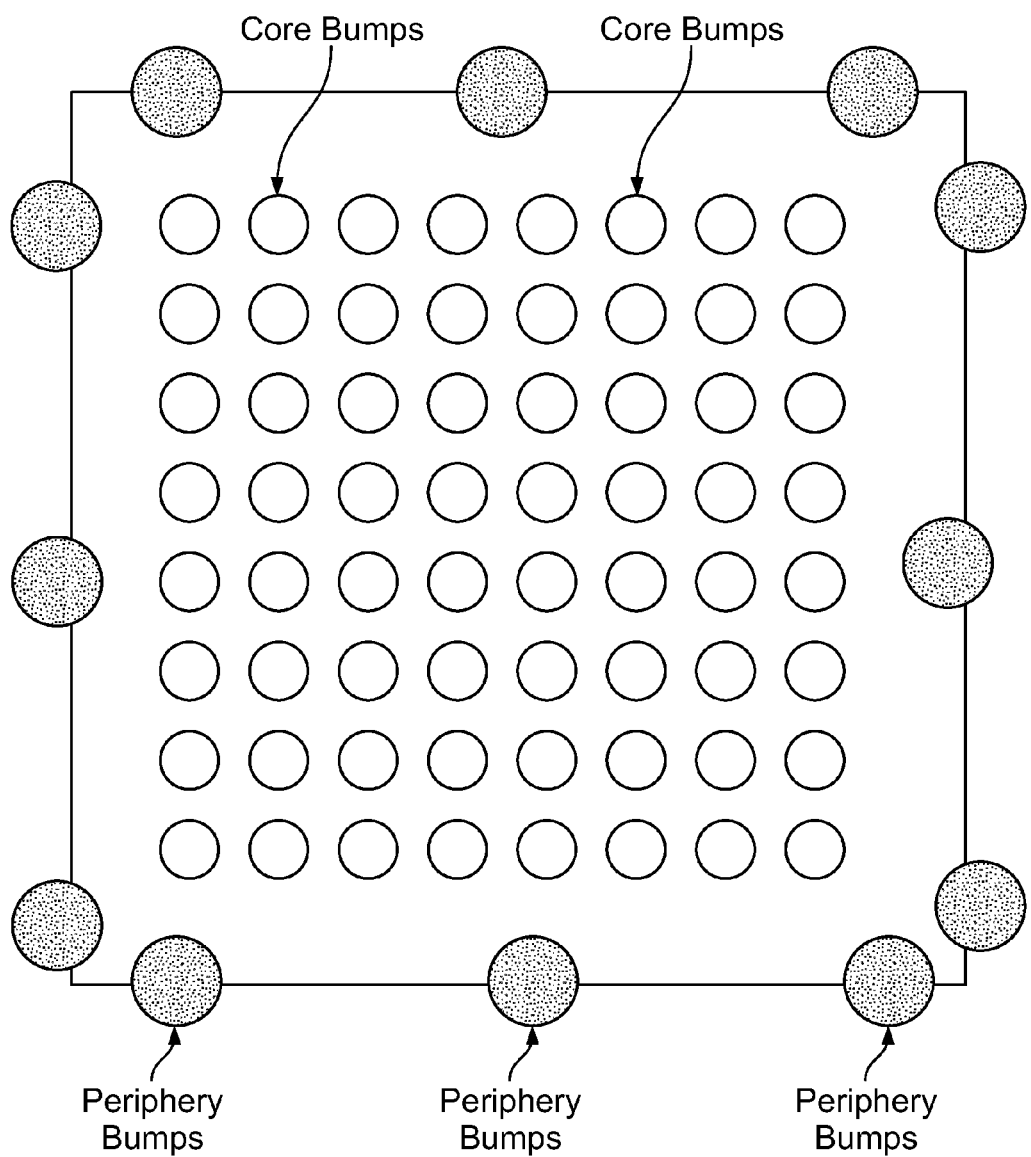
FIG. 6 shows an integrated circuit package with bumps.

FIG. 6 shows a package for an integrated circuit with bumps used to input and output signals, power, and generally to provide electrical connections. The package holds or encases an integrated circuit and bumps facilitate electrical connections between the integrated circuit. There are periphery bumps and core bumps. The periphery bumps surround or enclose the core bumps, which are in a center of the package area. The periphery bumps will make contact with pads at the periphery of the integrated circuit while the core bumps will make contact with pads at a core of the integrated circuit.

In the integrated circuit, there are voltage rails, which are a collection of pieces of metal found inside a chip. These are used to deliver power from a chip package to the semiconductor devices (e.g., transistors) inside the chip. The semiconductor devices are used to create the configurable logic, such as logic array blocks, of a programmable integrated circuit.

The package has bumps. In one type of package known as a flip-chip, the chip or integrated circuit is connected to the package by small metal pieces in the package which abut against the chip or integrated circuit.

The package has solder balls or balls. In a flip-chip package, the package is connected to the board by balls of lead which are melted during the assembly process, thus connecting the package to the board.

When testing integrated circuits after fabrication, they undergo a procedure known as binning. During binning, chips are categorized according to different speeds. Chips that are found to be faster sell may be sold for higher prices, and slower parts usually are priced lower.

Voltage drop is a term used to describe a situation where (for reasons that will be explained shortly) the voltage rails inside a chip collapse (voltage-wise) slightly (i.e. their absolute magnitude—as measured against system ground—becomes smaller), and the semiconductor devices have to take their current from a voltage source that is lower. This has the adverse effect of reducing the performance of those semiconductor devices.

Since performance is one of the major features of any semiconductor devices, one can either account for that performance drop, for example, by changing the criteria for binning devices, or enhance the quality of the voltage rails, such as by making them wider.

Both changes to the binning criteria, or changes to the voltage rails, have a negative impact on the price of the devices. Enhancing the quality of the rails may increase processing cost because, for example, the rails may be wider which may make a larger die size. Therefore, it is very desirable to be able to accurately predict the voltage drop inside a device.

When not taking into account the voltage drop effect at all, and assuming that the chips all have a perfect power supply, this may lead to devices delivered to customers which cannot function at the guaranteed speed.

One approach to take into consideration the voltage drop effect is to guard-band by assuming a worse-than-reality voltage drop. This will usually lead to devices which are sold as slow devices (i.e., for a lower price). But in reality, these devices can function up to a higher speed and therefore be sold for a higher price.

Another approach to take into consideration the voltage drop effect is to guard-band by over-designing the voltage rails: This means adding more metal to the voltage rails, thus making the chip bigger. Bigger chips cost more to manufacture, and will therefore decrease the profit margin for the device.

Figure 7:
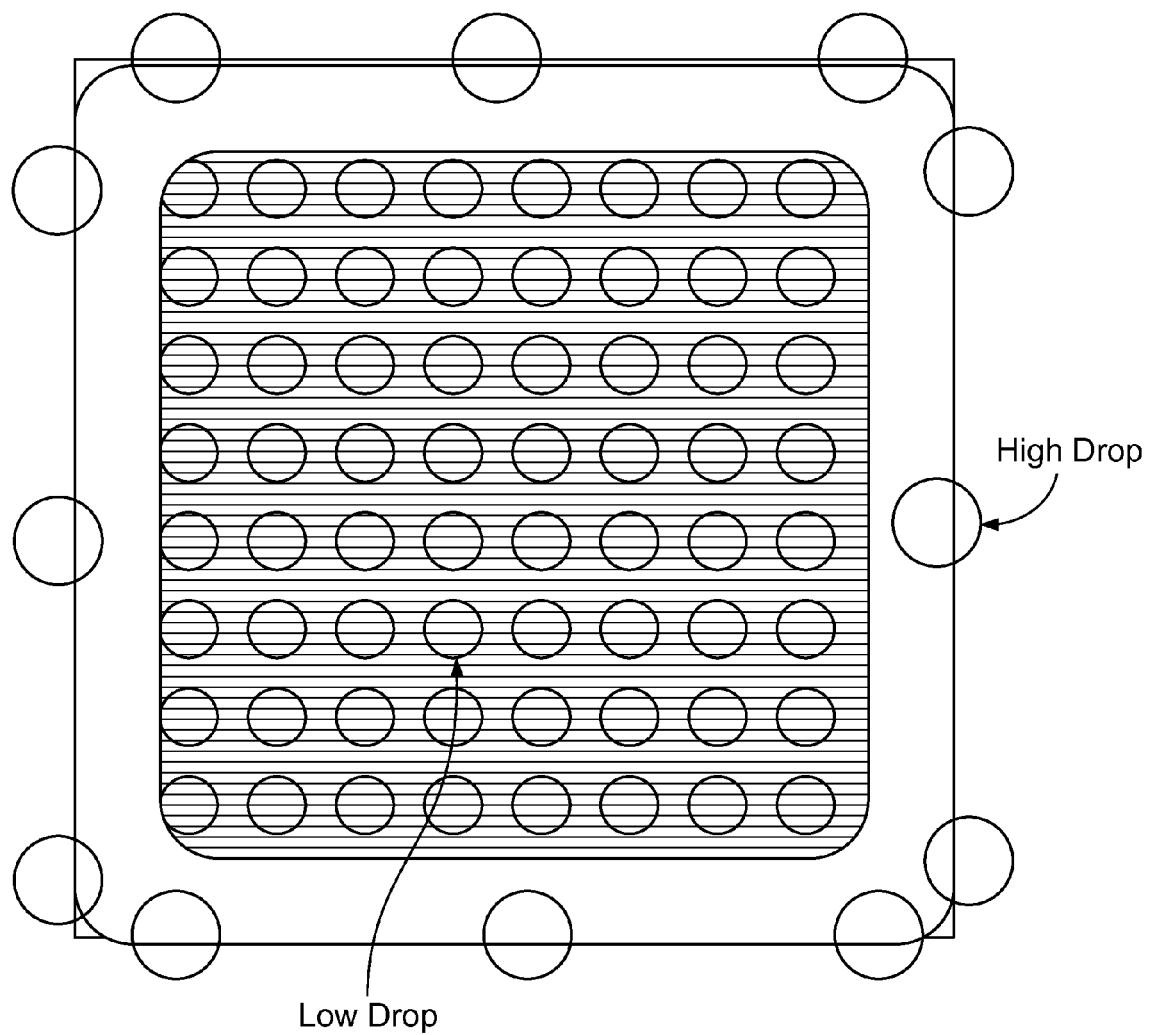
FIG. 7 shows an integrated circuit divided into a high drop region and a low drop region.

FIG. 7 shows an integrated circuit with different voltage domains indicated. The integrated circuit package has periphery region bumps and core region bumps. Periphery bumps will be used to connect to pads of the integrated circuit in a periphery bump region, which is shown as a high voltage drop region. Core bumps will be used to connect to pads of the integrated circuit in the core bump region, which is shown as a low voltage drop region, relative to the high drop region. Although only to voltage drop regions are shown, there integrated circuit may be divided into any number of voltage drop regions, such as three, four, five, six, seven, eight, or more than eight regions.

Circuitry and devices, including transistors, resistances, logic array blocks, look-up tables, registers, and others, in a particular region of the integrated circuit are connected to voltage rails of that region. For example, circuitry and logic in the periphery bump region are connected to voltage rails of the periphery bump region and will have a voltage drop characteristic (e.g., high voltage drop) associated with the periphery bump region. Circuitry and logic in the periphery bump region are connected to voltage rails of the core bump region and will have a voltage drop characteristic (e.g., low voltage drop) associated with the periphery bump region. Also, the voltage drops in the periphery region may vary, so there will be a voltage drop range, and voltage drops in the core region may vary, so there will be a voltage drop range.

In a typical flip-chip device, there are many bumps concentrated in the center of the die. These may be referred to as "core bumps." Many bumps mean that the voltage drop in the center of the die will generally be small. There are typically fewer bumps in the periphery of the die. These may be referred as "periphery bumps." Few bumps mean that the voltage drop in the periphery will be significantly higher in that area. Typically, it is not possible to add more bumps at the periphery, since that area of the die is heavily congested with routing. The periphery is where the data signals to and from the I/Os are situated.

A downside of not taking into consideration the speed characteristics of the logic array blocks or other configurable logic elements in particular regions of the integrated circuit is to leave performance on the table. This means making overly-pessimistic assumptions about a design, and thus not being able to guarantee its correct operation even in cases where in reality there will be no performance issue.

Referring to FIG. 7, there is a different voltage drop in the center of the die than in the periphery. For the sake of illustration, let's assume that the drop in the center of the die is 1 millivolt, which has a 1 percent impact on performance. The drop at the periphery is 10 millivolts, which has a 10 percent impact on performance. By taking the worst-case drop (i.e., 10 millivolts), we penalize the core area which in reality has a very low voltage drop. This means that for the majority of devices, we are being overly pessimistic in our estimation of speed, which directly translates to lower profit margins, for reasons explained.

A technique of the invention involves separating a chip into two or more different regions as illustrated in FIG. 7, each being a different voltage domain. In each of the regions, we will quantify the voltage drop, and its impact on performance. The place and route engine (or another tool of the computer-aided design flow) will then take these different timings into account while performing partitioning of the device (e.g., implementing a user's logic design into the logic array blocks).

Taking a LAB as an example, the LABs in the "low drop" area will be characterized as being faster than those in the "high drop" area, so the place and route engine will try to utilize those first to meet timing, using the LABs in the "high drop" area only for less speed-critical paths.

There are many advantages to dividing the chip into "low-drop" (i.e. fast) and "high-drop" (i.e. slow) areas: The components in the core area are not penalized for the drop of the periphery area. There is an ability to achieve higher device performance, due to paths in the core being modeled more accurately. There is not a need to make the voltage rails of the core larger to compensate for the drop at the periphery. Furthermore, our knowledge of the drop characteristics of the different die regions will permit us to shrink the size of the devices, since we will not need as much metal allocated to power. Faster paths mean higher Fmax.

In one implementation, the invention is a method of using a programmable integrated circuit comprising. Logic array blocks of the programmable integrated circuit are divided into a first set of logic array blocks and a second set of logic array blocks. Logic array blocks in the first set are defined as having a first voltage drop characteristic. Logic array blocks in the second set are defined as having a second voltage drop characteristic. The first voltage drop characteristic is greater than the second voltage drop characteristic. This means that the first voltage drops, which may vary in a range for the region, will be greater than the second voltage drops.

A user logic design is implemented into the logic array blocks of the programmable integrated circuit. The user logic design is assigned to logic array blocks having the second voltage drop characteristic before logic array blocks comprising the first voltage characteristic. The logic array blocks having the second voltage drop characteristic will be faster than those having the first voltage drop characteristic. In other words, the logic array blocks having the first voltage drop characteristic have a greater performance delay than the logic array blocks comprising the second voltage drop characteristic. To improve the speed of the logic paths, the logic array blocks having the second voltage drop characteristic will be used before the other logic array blocks.

In another implementation, the invention is a computer-readable medium having computer-executable instructions for performing a method. The method includes identifying in a programmable integrated circuit regions, where first voltage rails in a first region have a first voltage drop range and second voltage rails in a second region has a second voltage drop range. A first path of a user design, to be implemented in the programmable integrated circuit, is indicated as a critical path. This may be selected by a user using a pointer device or mouse and a display screen.

The method attempts to determine a configuration of logic blocks in the second region of the programmable integrated circuit to implement the first path of the user design. Logic blocks in the second region are connected to at least one of the second voltage rails. As discussed above, the logic blocks in the second region may have a faster timing characteristic than logic blocks in the first region of the programmable integrated circuit. The first region may be at a periphery of the integrated circuit and the second region may be a core of the programmable integrated circuit. The first region may surround the second region.

The method may provide an indication if a configuration of logic blocks in the second region cannot be determined for implementing the first path. This means it was not possible to place the critical path entirely using entirely low voltage drop logic array blocks. The user is notified by, for example, a warning message on the screen. The user can then make adjustments to the design or other parameters so the critical path will utilize logic blocks in the second region.

Further, the method may attempt to determine a configuration of logic blocks in the first region of the programmable integrated circuit to implement a second path, not indicated as a critical path, of the user design. The logic blocks in the first region are connected to at least one of the first voltage rails. For non-critical paths of the logic, these may be placed in the high voltage drop region.

The method may provide a selectable voltage drop value. The first voltage drop range will have voltage drops greater than the voltage drop value, and the second voltage drop range will have voltage drops less than the voltage drop value. The user may select the voltage drop value and the voltage domains will be divided according to this value. Furthermore, there may be more than two voltage drop regions, such as three or more different regions.

In another implementation, the invention is a system of implementing a user design in a programmable logic integrated circuit including: a database component having the user design and a first path of the user design indicated as a critical path; a place and route tool component, where the tool considers a voltage drop characteristic of logic blocks of the programmable logic integrated circuit when attempting to implement the first path; and a display component, providing a graphical user interface to the place and route tool component. Using this system, voltage drop is a characteristic which is taken into consideration when placing and routing the logic in the integrated circuit. The system will optimize to improve the performance of the logic when implemented in the integrated circuit.

The system may further include a timing analysis tool component, where the tool evaluates a timing characteristic of the first path. The system may further include a bitstream generation tool component, where the tool generates a bitstream pattern used to configured the programmable logic integrated circuit to implement the first path.

The programmable logic integrated circuit may have a plurality of regions, where first voltage rails in a first region have a first voltage drop range and second voltage rails in a second region has a second voltage drop range. Logic blocks in the second region have a faster timing than in the first region. Logic blocks to implement the first path are in the second region.

The programmable logic integrated circuit may have a plurality of regions, where first voltage rails in a first region have a first voltage drop range and second voltage rails in a second region has a second voltage drop range. Logic blocks in the second region have a faster timing than in the first region. The place and route tool component provides an indication on the display component when at least one logic block to implement the first path is not in the second region.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method of using a programmable integrated circuit comprising:
    dividing, using processing circuitry, a plurality of logic array blocks of the programmable integrated circuit into a first set of logic array blocks and a second set of logic array blocks;
    defining the logic array blocks in the first set as comprising a first voltage drop characteristic;
    defining the logic array blocks in the second set as comprising a second voltage drop characteristic, wherein the first voltage drop characteristic is greater than the second voltage drop characteristic; and
    implementing a user logic design into logic array blocks of the programmable integrated circuit, wherein the user logic design is assigned to logic array blocks comprising the second voltage drop characteristic before logic array blocks comprising the first voltage characteristic;
    wherein the logic array blocks comprising the first voltage drop characteristic have a greater performance delay than the logic array blocks comprising the second voltage drop characteristic.

2. The method of claim 1 wherein the logic array blocks comprising the first voltage drop characteristic are in a periphery region of a die of the integrated circuit.

3. The method of claim 1 wherein the logic array blocks comprising the second voltage drop characteristic are in a core region of a die of the integrated circuit.

4. The method of claim 1 wherein a die of the integrated circuit has a periphery region enclosing a core region, and logic array blocks comprising the first voltage drop characteristic are in the periphery region and logic array blocks comprising the second voltage drop characteristic are in the core region.

5. The method of claim 1 wherein the first voltage drop characteristic is 10 percent or greater of an expected voltage level.

6. The method of claim 1 wherein implementing a user logic design into logic array blocks of the programmable integrated circuit comprises:
    partitioning the user logic design into logic-array-block elements;
    assigning the logic-array-block elements to the logic array blocks of the programmable integrated circuit; and
    routing signals between the assigned logic array blocks.

7. A non-transitory computer-readable medium having computer-executable instructions for performing a method comprising:
    identifying in a programmable integrated circuit a plurality of regions, wherein first voltage rails in a first region have a first voltage drop range and second voltage rails in a second region have a second voltage drop range;
    indicating a first path of a user design, to be implemented in the programmable integrated circuit, as a critical path; and
    attempting to determine a configuration of logic blocks in the second region of the programmable integrated circuit to implement the first path of the user design, wherein logic blocks in the second region are coupled to at least one of the second voltage rails; and
    providing an indication if a configuration of logic blocks in the second region cannot be determined for implementing the first path.

8. The method of claim 7 wherein the logic blocks in the second region have a faster timing characteristic than logic blocks in the first region of the programmable integrated circuit.

9. The method of claim 7 further comprising:
    attempting to determine a configuration of logic blocks in the first region of the programmable integrated circuit to implement a second path, not indicated as a critical path, of the user design, wherein logic blocks in the first region are coupled to at least one of the first voltage rails.

10. The method of claim 7 wherein the indicating of a first path of a user design as a critical path comprises:
    pointing at the first path on a display using a selection device.

11. The method of claim 7 wherein identifying in a programmable integrated circuit a plurality of regions comprises:
    providing a voltage drop value, wherein the first voltage drop range will have voltage drops greater than the voltage drop value, and the second voltage drop range will have voltage drops less than the voltage drop value.

12. The method of claim 7 wherein the first region is a periphery of the integrated circuit and the second region is a core of the programmable integrated circuit, and the first region surrounds the second region.

13. The method of claim 7 further comprising:
    identifying in the programmable integrated circuit a third region comprising third voltage rails having a third voltage drop range.

* * * * *